United States Patent [19]

Kobayashi et al.

[11] Patent Number: 4,987,092

[45] Date of Patent: Jan. 22, 1991

[54] PROCESS FOR MANUFACTURING STACKED SEMICONDUCTOR DEVICES

[75] Inventors: Kiyoteru Kobayashi; Tadashi Nishimura; Hiroshi Morita; Shuji Nakao; Hidekazu Oda; Yasuo Inoue, all of Hyogo, Japan

[73] Assignee: Mitsubishi Denki Kabushiki Kaisha, Tokyo, Japan

[21] Appl. No.: 204,581

[22] Filed: Jun. 9, 1988

[30] Foreign Application Priority Data

Jun. 10, 1987 [JP] Japan .................................. 62-145847

[51] Int. Cl.$^5$ .......................................... H01L 21/225
[52] U.S. Cl. .......................................... 437/57; 437/49; 437/56; 437/156; 437/158; 437/915; 437/162
[58] Field of Search .................. 437/48, 49, 56, 57, 437/156, 158, 915, 162, 40, 41, 44, 46, 100; 357/42, 44

[56] References Cited

U.S. PATENT DOCUMENTS

| | | | |
|---|---|---|---|
| 4,467,518 | 8/1984 | Bansal et al. | 437/162 |
| 4,476,475 | 10/1984 | Naem et al. | 357/44 |
| 4,502,202 | 3/1985 | Malhi | 437/915 |
| 4,554,572 | 11/1985 | Chatterjee | 357/42 |
| 4,603,468 | 8/1985 | Lam et al. | 148/DIG. 164 |
| 4,628,589 | 12/1986 | Sundaresan | 437/915 |
| 4,651,408 | 3/1987 | MacElwee et al. | 437/915 |
| 4,654,121 | 3/1987 | Miller et al. | 437/57 |
| 4,656,731 | 4/1987 | Lam et al. | 437/915 |
| 4,691,433 | 9/1987 | Pimbley et al. | 437/44 |
| 4,789,644 | 12/1988 | Meda | 437/46 |

OTHER PUBLICATIONS

IEDM 84: "A Fully Self-Aligned Stacked CMOS 64K SRAM", by R. Sundaresan et al., 34.9 1984, pp. 871-873.

Colinge et al., "A High Intensity CMOS Inverter with Stacked Transistors", IEEE Electron Device Letters, vol. EDL-2, No. 10, Oct. 1981, pp. 250-251.

Primary Examiner—Brian E. Hearn
Assistant Examiner—Tuan Nguyen
Attorney, Agent, or Firm—Lowe, Price, Leblanc, Becker & Shur

[57] ABSTRACT

An improved method of manufacturing semiconductor devices having a stacked structure is disclosed. A p-channel semiconductor substrate is prepared, and on the major surface of the substrate, n-channel source and drain regions and a gate electrode are formed to provide a n-channel transistor. Sidewalls are formed of P type single-crystal silicon on the opposite size of the gate electrode of n-channel transistor with an insulating layer interposed between the sidewalls and the gate electrode. A single-crystal layer covers the source, drain and gate electrode of the n-channel transistor and the sidewall structures. A P type impurity present in the sidewalls is diffused into the single-crystal layer.

16 Claims, 15 Drawing Sheets

PROCESS FOR MANUFACTURING STACKED SEMICONDUCTOR DEVICES

BACKGROUND OF THE INVENTION

1. Field of the Invention

This invention relates to a method for manufacturing semiconductor devices, and more particularly to the method for manufacturing stacked CMOS semiconductor devices.

2. Description of the Prior Art

Since this invention produces most desirable results when applied to a fabrication process of a CMOS (Complementary Metal Oxide Semiconductor) static RAM (Random Access Memory), it should be noted that the present invention will be described hereinafter in connection with the CMOS static RAM without necessarily intending to limit the invention thereto.

A CMOS static RAM or CMOS is conventionally known and the typical structure of such prior art CMOS SRAM is shown in FIG. 1. Referring now to FIG. 1, the SRAM includes a memory cell array 41 in which a plurality of word lines and a plurality of the lines are arranged to intersect with each other. A memory cell 40 is provided at each of the intersections or junctions of the word lines and bit lines. The SRAM also includes an X decoder 42 and a Y decoder 43 which operate to select one of the word lines and one of the bit lines, respectively, at a time whereby selecting a particular memory cell at a junction of the selected word line and the selected bit line. In a data writing operation, input data or Din is fed to the selected memory cell, while in a data read-out operation, the data stored in the selected memory cell is read out and then amplified by a sense amplifier 44 before it is fed out as output data or Dout.

FIG. 2 illustrates schematically an equivalent circuit of any one 40 of the memory cells in the memory cell array 41 of the CMOS shown in FIG. 1. The memory cell 40 includes n-channel MOS transistors T5, T6 which form a gate circuit, and a pair of CMOS inverters, one being comprised of p-channel MOS transistors T1, T3 and the other being comprised of n-channel MOS transistors T2, T4. The gates of MOS transistors T5, T6 are both connected to the word line 35, while each one of the remaining two electrodes in transistors T5, T6 is connected to the bit line 33, 34, respectively.

With this general construction, when it is intended to read out the data stored in a memory cell, a predetermined voltage is applied on the word line 35, and then voltages appears on the bit line 33, 34, the levels of which corresponds to the state of the respective inverters T1-T2, T3-T4. On the other hand, when it is desired to write data into the memory cell, a predetermined voltage is first applied on the word line 35, and then write-in voltage is impressed on the bit lines 33, 34.

FIGS. 3A to 3C illustrate, step by step, the prior art process of manufacturing a pattern layout for the memory cell. As shown in FIG. 3A, there is formed on the surface of the p-channel semiconductor substrate 1, N type well 51 and N type diffusion regions 27. P type diffusion region 26 is then formed on the N type well 51. Also formed on the preselected area of the substrate surface are a word line 35a and gate layers 35 (FIG. 3B). Thereafter as shown in FIG. 3C, ground conductors 31, 32 and bit lines 33, 34 are formed of aluminum. Aluminum conductors 61, 62 are provided. The aluminum conductor 61 is provided for supplying source voltage Vcc to the N type well 51 through p-type diffusion layer 26, and the aluminum conductor 62 for connecting the gate layer 35 with the diffusion regions 26 and 27. More specifically, the aluminum conductor 61 connects N type well region 51 and the p-type diffusion layer 26 via a contact 6a, while the aluminum conductor 62 connects the diffusion layers 26 and 27 through contacts 6b and 7a, respectively. The aluminum conductor 62 is also communicated to the gate layers 35 via a contact 6c. The ground conductors 31, 32 are coupled with the N type diffusion layer 27 via a contact 7c, and the bit lines 33, 34 are also coupled with the N type diffusion region 27 via still another contact 7b.

FIGS. 4A to 4G illustrate schematically the steps of fabricating a CMOS inverter incorporated in the memory cell of the prior art SRAM. It should be pointed out that these figures show a portion of the memory cell in cross section as taken along lines IV—IV.

According to the conventional process, there is formed on a p-channel silicon substrate 1 a silicon oxide layer 101 using, for example, a thermal oxidation technique. The silicon nitride layer 102 is provided over the silicon oxide layer 101 (FIG. 4A). Using this silicon nitride layer 102 as a mask, a selective oxidation is carried out to obtain a thick silicon oxide layer 103, and the remaining silicon nitride layer 102 is removed. Next, using the thick silicon oxide layer 103 as a mask, phosphorus ions are implanted into the p-type silicon substrate 1 by means of an ion injection technique (FIG. 4B).

Now the substrate is subject to a heat treatment in order to diffuse the phosphorus ions into the substrate, resulting in the formation of a N type well 51. Then another silicon oxide layer 104 and silicon nitride layer 105 are provided over the silicon substrate 1 in a similar manner previously described. Utilizing photoresist 106 formed on the prescribed region of the two layers 104, 105 as a mask, portions of the silicon nitride layer 105 are etched away FIG. 4C). Using the silicon nitride again as a mask, another selective oxidation is preformed to obtain a thick field oxide layer 107. When the desired field oxide layer 107 is formed, the silicon nitride layer 105 and the silicon oxide layer 14 are both removed. As shown in FIG. 4D, after depositing a gate oxide layer 110, a plurality of polysilicon layers 109a–109d are formed. In the step illustrated in FIG. 4E, boron ions are injected or implanted into the substrate 1 in order to selectively form p-type diffusion layer 26. Arsenic ions are similarly injected to selectively obtain n-type diffusion layer 27. The formation of p-type diffusion layer 26 results in the formation of a p-type field effect transistor T3, while the formation of the n-type diffusion layer brings about the formation of n-type field effect transistor T4 (FIG. 4E).

In the next step shown in FIG. 4F, a silicon oxide layer 111 is again deposited over the substrate to cover its upper surface as by CVD Chemical Vapor Deposition). A plurality of contact holes 6b, 6c and 7a are made in the silicon oxide layer 111 by using photolithography and etching operations. An aluminum conductor 62 is formed and the resulting device is covered by a passivation layer 112 (FIG. 4G).

In the past, the CMOS inverter which is included in a memory cell in the prior art SRAM was fabricated according to the process described above. And in the prior art process, the CMOS inverter was made in the form of a single planar layer, thus making it difficult to integrate component elements. For the purpose of improving the integration of the device, a stacked CMOS structure or arrangement has recently being proposed and adopted by the design engineers.

FIG. 5A to 5F are partial cross sections of a typical stacked CMOS structure showing various steps of manufacturing the same. Referring first to FIG. 5A, there is formed on a p-type silicon substrate 1 a silicon oxide layer 2 as by using the thermal oxidation operation. On this silicon oxide layer 2, phosphorous doped polysilicon layer is deposited using, for example, a CVD process under low pressure conditions. Then a gate electrode 3 is formed on the silicon oxide layer 2 by the standard photolithography and etching techniques. Arsenic ions are implanted in a self-alignment manner with the gate electrode acting as a mask and, as a result, a n-type MOS transistor comprising source 4, drain 5 and channel region 6 is obtained (FIG. 5B).

A silicon oxide layer 7 is provided as by the thermal oxidation so that the layer covers the gate electrode 3. By means of the known photolithography or etching technique, an aperture or opening 8 is made in the silicon oxide layer 2 at a position above the drain region 5 of the n-channel MOS transistor (FIG. 5C). Subsequent to this step, a polysilicon layer 16 is disposed as by CVD under low pressure conditions (FIG. 5D). Then, a photoresist 17 is patterned on the prescribed region of the polysilicon layer 16 by the photolithographic process, after which boron ions are implanted using the resist 17 as a mask (FIG. 5E). Upon removing the resist 17, the entire substrate 1 is then subject to a heat treatment, resulting in the formation of p-channel MOS transistor comprising source 12, drain 13 and channel region 14 (FIG. 5F). It should be noted here that drain 5 of the n-channel MOS transistor mentioned above and source 12 of this p-channel MOS transistor are connected each other via the opening 8, thus establishing a p-n junction of the CMOS structure.

The operation of the stacked CMOS is now explained. Here we define that the threshold voltage for the p-channel MOS transistor at $V_{TP}$ and threshold voltage for the n-channel MOS transistor at $V_{TN}$ (where $V_{TN} > V_{TP}$). The drain of the p-channel MOS transistor is connected to a positive potential $V_{DD}$, while the source of the n-channel MOS transistor is connected to ground with a voltage $V_{CC}$ being applied to the common gate electrode 3. If the gate potential $V_{CC}$ is higher than the threshold voltage $V_{TN}$ of the n-channel MOS transistor, that is $V_{CC} > V_{TN}$, then the n-channel MOS transistor is kept ON, while the p-channel MOS. transistor is kept OFF. On the other hand, if the threshold voltage $V_{TP}$ of the p-channel MOS transistor is higher than the gate potential $V_{CC}$ or $V_{TP} > V_{CC}$, then p-channel MOS transistor is ON, while the n-channel MOS transistor is OFF.

In this manner with the stacked CMOS, ON an OFF states of the two different transistors, that is the n-and p-channel MOS transistors can be controlled by one and the same gate electrode 3 which is common to the both MOS transistors.

In the prior art method of manufacturing stacked semiconductor devices, source 12 and drain 13 of the p-channel MOS transistor are formed by the implant of boron ions. However, this boron implantation involves the use of the resist 17 as a mask, which causes a serious problem because, when the resist is disposed by the photolithographic process, it is absolutely necessary for the resist 17 to precisely overlap over or align with the gate electrode 3. It is no easy task to control the relative position of the resist to the gate electrode so that the former accurately overlaps with the latter. Another problem inherent in the prior art method resides in the fact that the distance between the source 12 and the drain 13 of the p-channel MOS transistor, that is the geometrical length L of the channel 14 as shown in FIG. 5F is dependent on the size R of the resist 17 as indicated in FIG. 5E. Stated differently, the length L of channel 14 is depending on the size R of the resist 17. Under the circumstances, it has been found that when stacked type semiconductor devices are manufactured on the mass production basis, it is extremely difficult to obtain the semiconductor devices having uniform performance characteristics because the characteristics of the p-channel MOS transistor, for example, its threshold voltage $V_{TP}$ changes according to the difference in the size R of the resist.

Another problem has also been pointed out. In the prior art process, the source 12, drain 13 and channel region 14 of the p-channel MOS transistor are all made of polysilicon layer. As can be readily understood by one skilled in the art, the polysilicon layer includes a countless number of grains and grain-boundaries, and therefore the layer does not have a complete crystalline structure. Due to this grain structure of the polysilicon layer, if there is potential difference between the source 12 and drain 13 of the p-channel MOS transistor while it is in OFF state, a leakage current flows between the source and the drain. This is undesirable because it contributes to an increased power consumption by the stacked semiconductor devices.

In order to avoid and overcome the above mentioned problems associated with the prior art manufacturing process, it has been proposed to build the p-channel MOS transistor using a self-aligned process as described in the article "A fully self-aligned stacked CMOS 64K SRAM" (R.Sundaresam et. al., IDEM 84, pp. 871-873).

FIG. 6A to 6C schematically illustrate some important steps in the fully self-aligned process disclosed in the article. According to this improved process, a stacked CMOS is manufactured as follows. On a semiconductor substrate 1, there are formed gate electrode 3, source region 4 and drain region 5 by using the steps previously discussed in connection with FIGS. 5A to 5C. A second polysilicon layer 16 is deposited on the gate electrode 3 with an insulating layer being interposed therebetween. A boron doped oxide layer 18 is then spun on top of the second polysilicon layer 16 (FIG. 6A). A plasma etch is used to remove the oxide from directly above the channel region leaving a sidewall structure (FIG. 6B). After deposition of cap oxide layer 19, a thermal anneal in an inner ambient drives in the boron from oxide into the polysilicon layer 16 to form the source and drain regions. The cap oxide layer 19 and the spin-on oxide layer 18 are then removed using a wet etchant (FIG. 6C).

With the improved process for the manufacture of stacked CMOS device having these steps, the source and drain of the p-channel MOS transistor are formed in a fully self-aligned manner, thus eliminating the complicated mask overlapping or alignment step.

However, the proposed fully self-aligned process still possesses some shortcomings. One shortcoming is that the sidewall structure of the boron doped oxide layer 18 which has grown on the polysilicon layer 16 is to be removed after the source and drain regions 4, 5 have been formed. Thus the polysilicon layer 16 comprising the source and drain regions is the same in thickness as it has been initially formed. In other words, the thickness of the polysilicon layer does not increase and, as a result, the electrical resistance of the polysilicon layer remains relatively large, which gives rise to the possibility that the read out operation in the transistor device is rather slow. Another possible shortcoming stems also from the same fact as pointed above. That is, the sidewall structure of the boron ion doped oxide layer 18 is to be removed after the formation of the source and drain regions as illustrated in FIG. 6C, thus the p-channel MOS transistor tends to have a sharp corners in its source and drain regions 4, 5, which renders the upper surface of the MOS transistor device uneven or irregular. This irregular surface, in turn, makes it difficult to patternize aluminum conductor layers on the surface of the resulted transistor.

SUMMARY OF THE INVENTION

Therefore, it is an object of the present invention to provide a method for manufacturing semiconductor devices which can be highly integrated.

It is another object of the invention to provide a method for manufacturing semiconductor devices wherein produced semiconductor devices have substantially the same performance characteristics.

It is another object of the invention to provide a method for manufacturing semiconductor devices which eliminate the necessity for controlling the overlapping or registering between a resist layer and a conductor layer such as a gate electrode.

It is another object of the invention to provide a method for manufacturing semiconductor devices wherein a leakage current within MOS transistors is greatly reduced.

It is still another object of the invention to provide a method for manufacturing semiconductor devices whose source and drain regions have a low electrical resistance.

It is still another object of the invention to provide a method for manufacturing semiconductor devices wherein a plurality of aluminum conductor layers are readily laid out in a desired circuit pattern.

It is still another object of the invention to provide a method for manufacturing semiconductor devices which has a relatively smooth surface.

It is still another object of the invention to provide SRAMs which are capable of being highly integrated.

In order to accomplish the above mentioned object, this invention provides a new and novel method for manufacturing semiconductor devices having a stacked structure. According to the method, there is first prepared a semiconductor substrate which has a major surface and contains an impurity of the first conductivity type having a predetermined concentration. First and second impurity regions are formed spaced apart from each other in the substrate at its major surface. A region between the impurity regions in the major surface of the substrate defines a first channel region.

According to the method of this invention, there is also applied a first insulating layer on the major surface of the substrate, and then the first conductor layer with opposing side surfaces is disposed on the first insulating layer at a location above the first channel region at least to extend over the channel region. The first conductor layer, the first insulating layer and the first and second impurity regions together comprise a semiconductor composite structure.

At least side surfaces of the first conductor layer of the semiconductor composite structure is covered by a second conductor layer with a second insulating layer interposed therebetween to form a sidewall structure of the first conductivity type. A third conductor layer is formed over the first conductor layer, the major surface of the substrate and the sidewall with the first insulating layer interposed between the third conductor layer and the major surface of the substrate, and with the second insulating layer interposed between the first conductor layer and the third conductor layer. The impurity of the first conductivity type is doped or diffused from the sidewall into the third conductor layer.

According to the method of this invention briefly described above, there is no need to control the overlapping between the resist and the first conductor layer such as a gate electrode. Therefore the usual resist alignment procedure is eliminated, manufacturing it possible to produce high density semiconductor devices.

Moreover according to the present method, since the sidewalls of the first conductivity type are formed of the conductor layer, the sidewalls remain even after the third conductor layer has been deposited, and these sidewalls form the source and drain regions of the first conductivity type. In consequence, the cross sectional area between the source and drain regions is increased, making it possible to manufacture the semiconductor devices with a lower source-to-drain resistance. The semiconductor device with the sidewall structures made according to the method of the present invention have a smooth major surface because the sidewalls remain after the third conductor layer is formed.

Moreover, according to the preferred embodiment of the invention, the formation of both the second and third conductor layers involves the formation of a polysilicon layer and the mono-crystallization of the polysilicon layer. The advantage of this is that the source and drain regions of a polysilicon layer is mono-crystallized, resulting in a reduced leakage current in the produced MOS transistor.

According to the further preferred embodiment of the invention, the mono-crystallization of the second and third conductor layers involves the process of implanting silicon ions into the polysilicon layer followed by turning the polysilicon layer into an amorphous silicon layer. Thus, the polysilicon layers are completely mono-crystallized.

These objects and other objects, features, aspects and advantages of the present invention will become more apparent from the following detailed description of the present invention when taken in conjunction with the accompanying drawings.

DESCRIPTION OF THE PREFERRED EMBODIMENTS

As it has been previously pointed out that this invention produces most desirable result when applied in the manufacture of CMOS SRAMs, the present invention is hereinbelow described in detail in connection with the manufacture of the CMOS SRAM.

Figure 1:
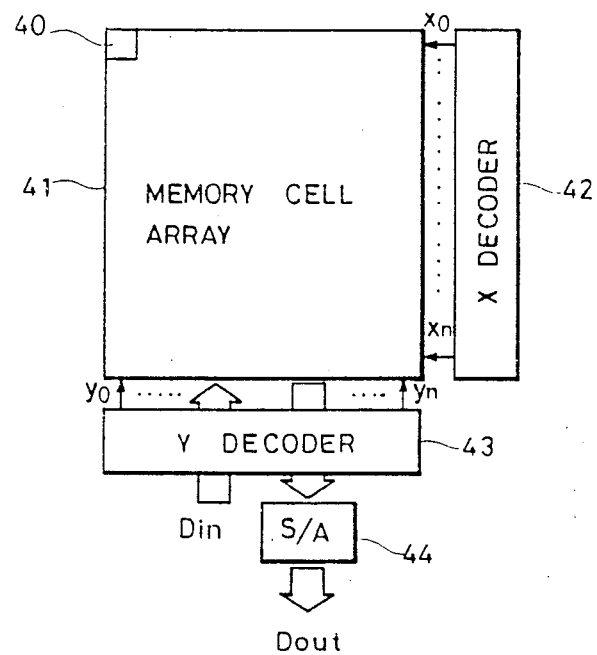
FIG. 1 is a block diagram schematically showing a general structure of SRAM.
Figure 2:
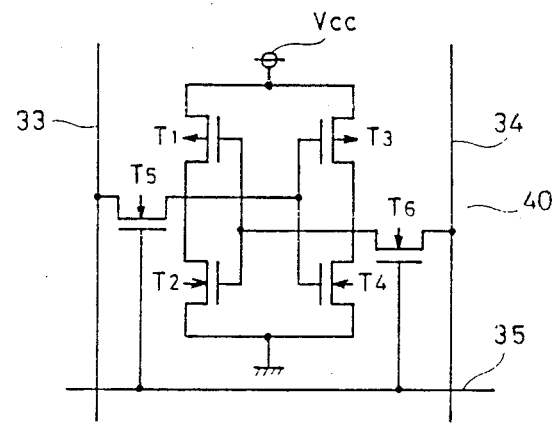
FIG. 2 is a circuit diagram showing an equivalent circuit of a prior art SRAM.
Figure 3A:
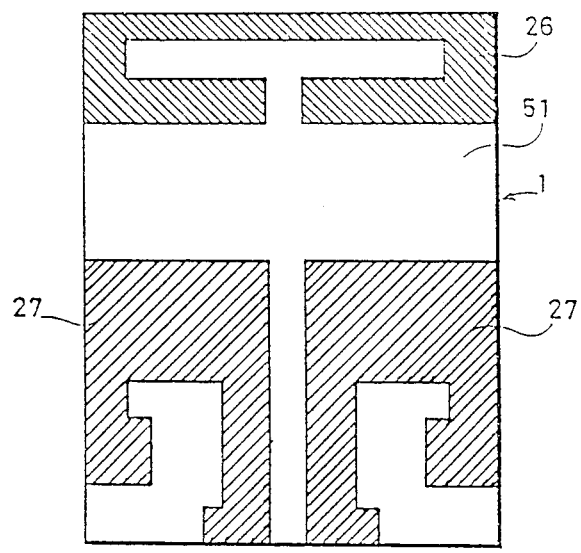
FIGS. 3A to 3C are plan views showing circuit pattern layouts of a typical prior art CMOS semiconductor device.
Figure 3B:
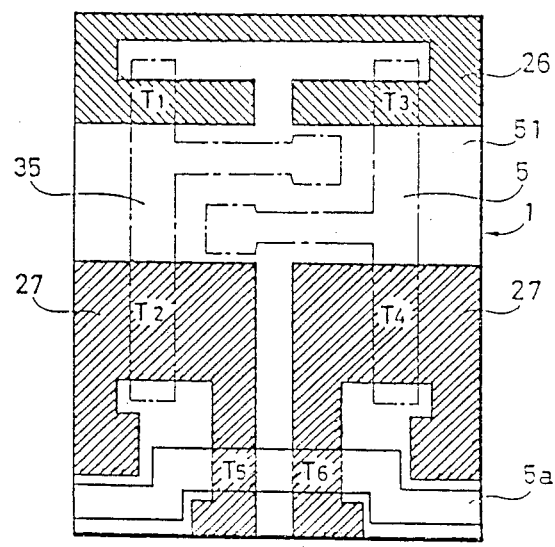
Figure 3C:
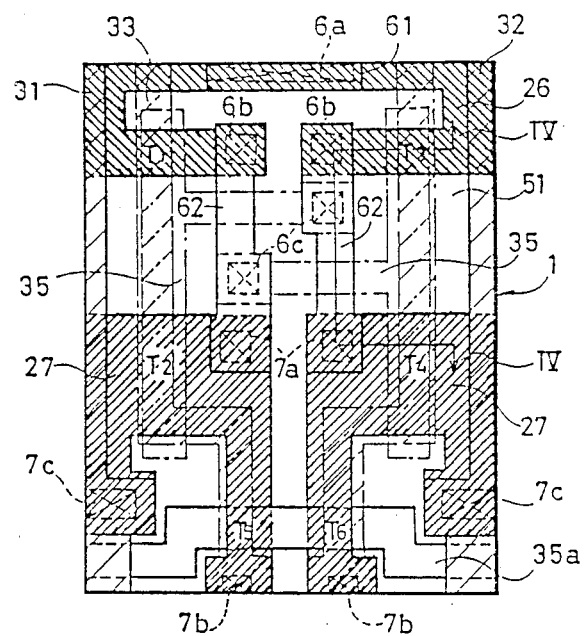
Figure 4A:
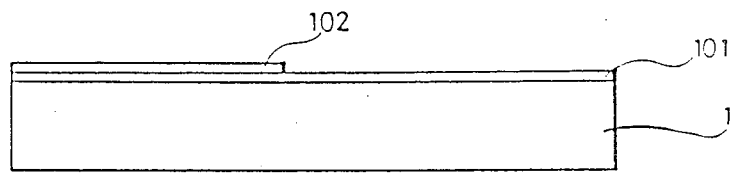
FIGS. 4A to 4G are cross sectional elevation views of the prior art CMOS semiconductor showing successive steps of manufacturing process therefor.
Figure 4B:
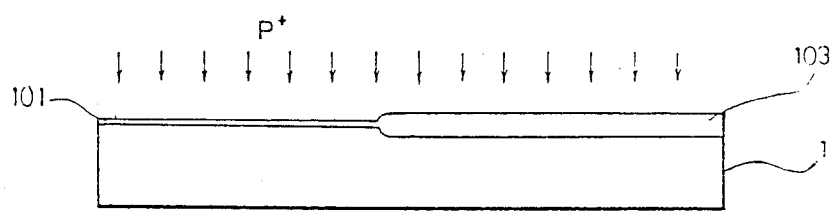
Figure 4C:
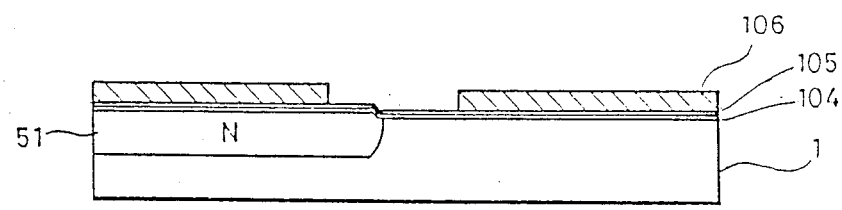
Figure 4D:
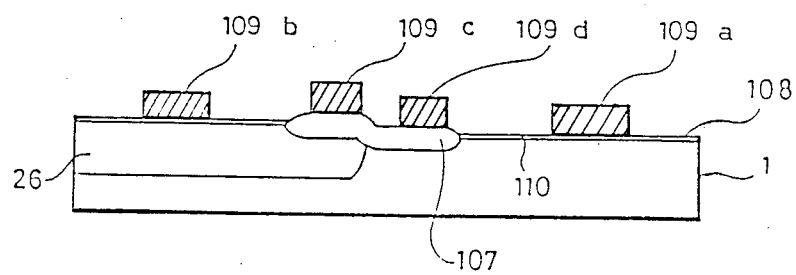
Figure 4E:
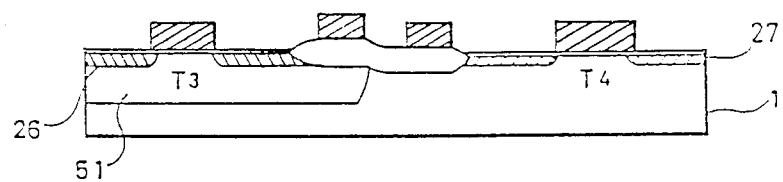
Figure 4F:
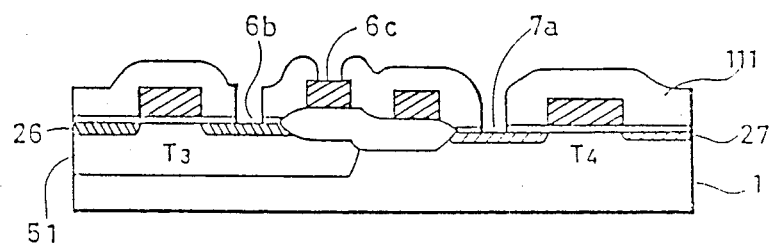
Figure 4G:
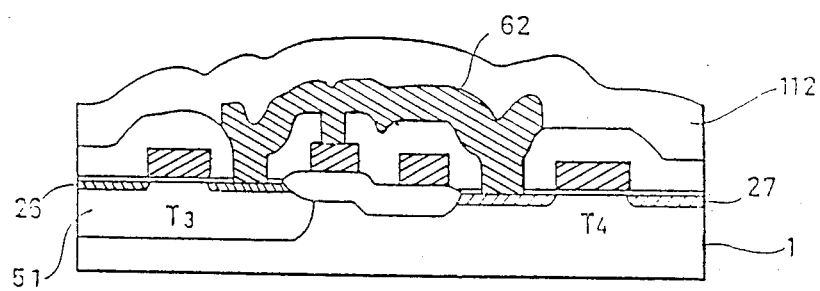
Figure 5A:
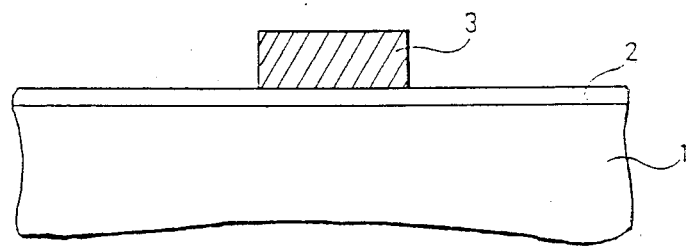
FIGS. 5A to 5F are cross sectional elevation views of a typical prior art stacked CMOS semiconductor device showing successive steps of the manufacturing process therefor.
Figure 5B:
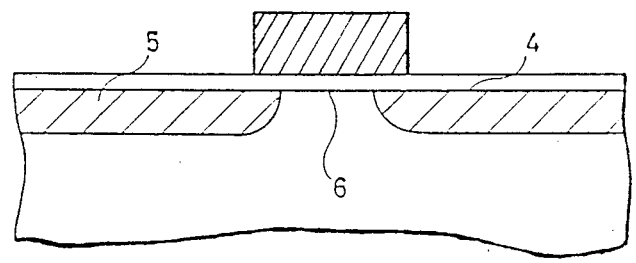
Figure 5C:
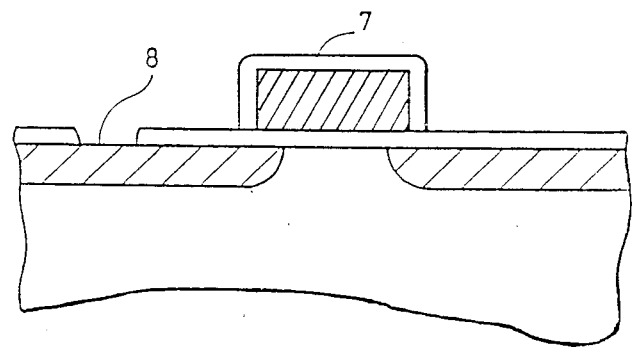
Figure 5D:
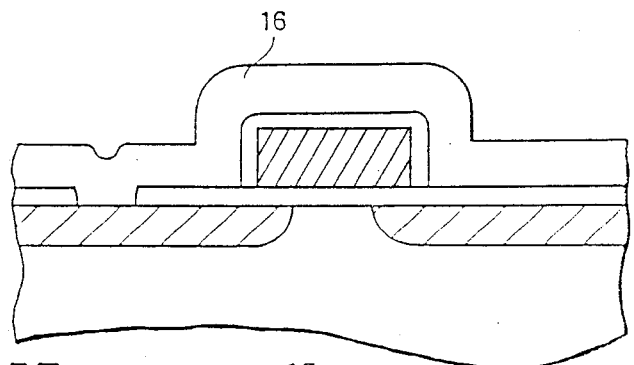
Figure 5E:
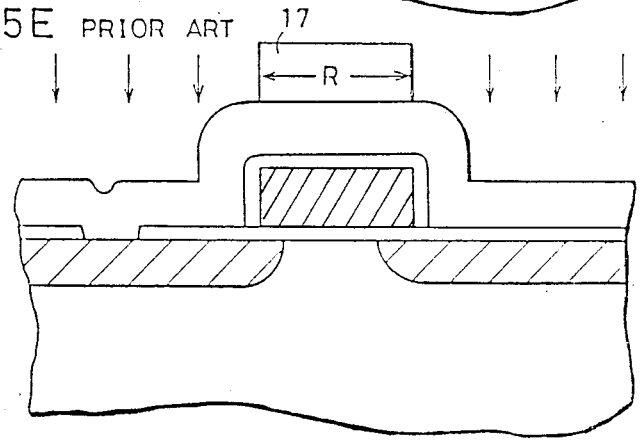
Figure 5F:
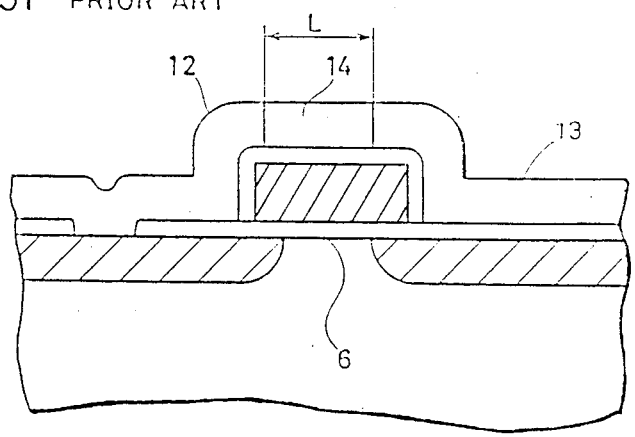
Figure 6A:
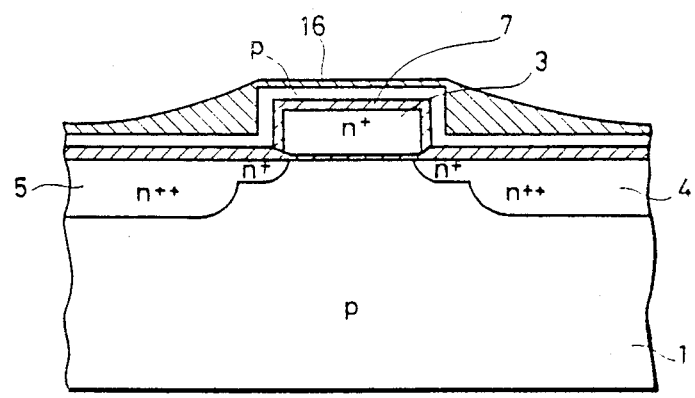
FIGS. 6A to 6C are cross sectional views of an improved prior art stacked CMOS semiconductor device showing successive steps for a manufacturing process.
Figure 6B:
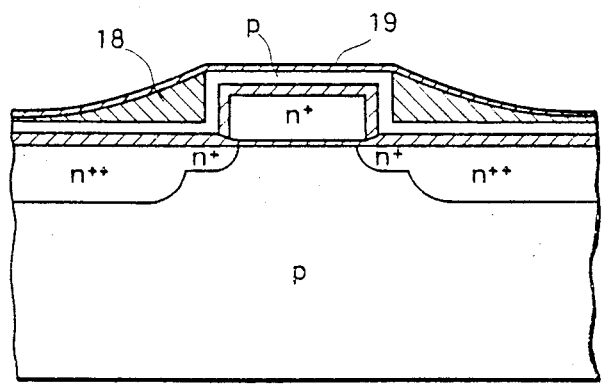
Figure 6C:
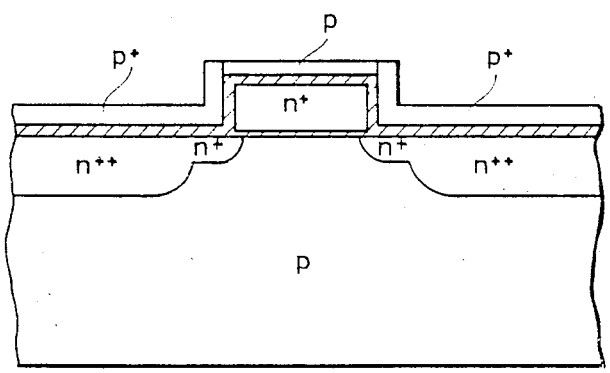
Figure 7A:
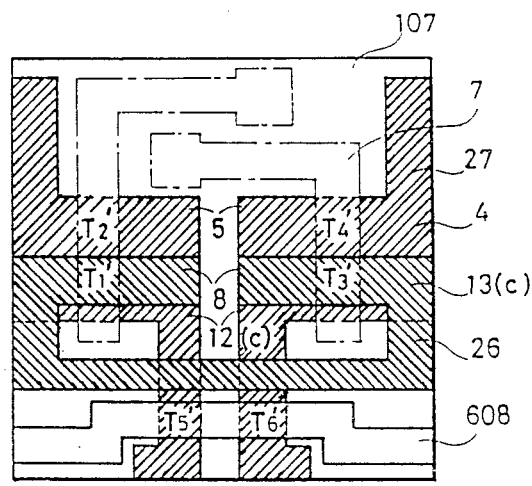
FIGS. 7A and 7B are plan views showing circuit pattern layouts of a CMOS semiconductor device to be made according to the method of this invention.
Figure 7B:
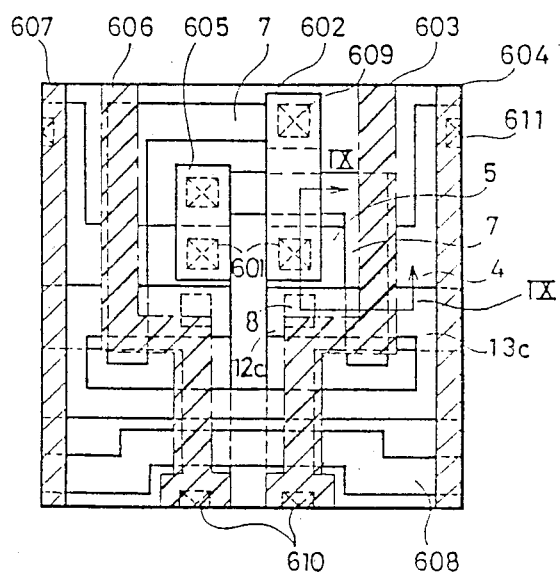

Now referring to the attached drawing, FIGS. 7A and 7B show circuit patterns of a memory cell in a SRAM having a stacked CMOS structure. FIG. 7A shows a lower circuit pattern of the SRAM and corresponds to FIG. 3A as discussed hereinabove in connection with the prior art manufacturing process, while FIG. 7B shows an upper circuit pattern of the same SRAM and corresponds to FIG. 3C. As illustrated in FIG. 7A, first there are formed on a semiconductor substrate, n-type diffusion layer 27 and p-type diffusion layer 26. Then the gate electrode 7 and a word line 608 are formed on the diffusion layers 26 and 27. n-type diffusion layer 27 includes n-type source region 4 and n-type drain region 5, while p-type diffusion layer 26 comprises p-type source region 12 and p-type drain region 13. In FIG. 7A, reference characters T1'-T6' correspond to T1-T6 shown in FIG. 3.

The circuit layout or pattern shown in FIG. 7B includes vertically extending ground lines 604, 607, bit lines 603, 606 and conductor layers 602, 605, all of which are made of aluminum. Aluminum conductor layers 602, 605 connect via a contact 601 with the drains 5 of the n-channel MOS transistor T1', T3', the gate 7 common to MOS transistors T1', T2' is connected with the aluminum conductor layer 602 via a contact 609. Bit line 603 is communicated with the drain of transistor T6' and the ground line 604 is connected to the source of the n-channel MOS transistor via a contact 611.

Figure 8:
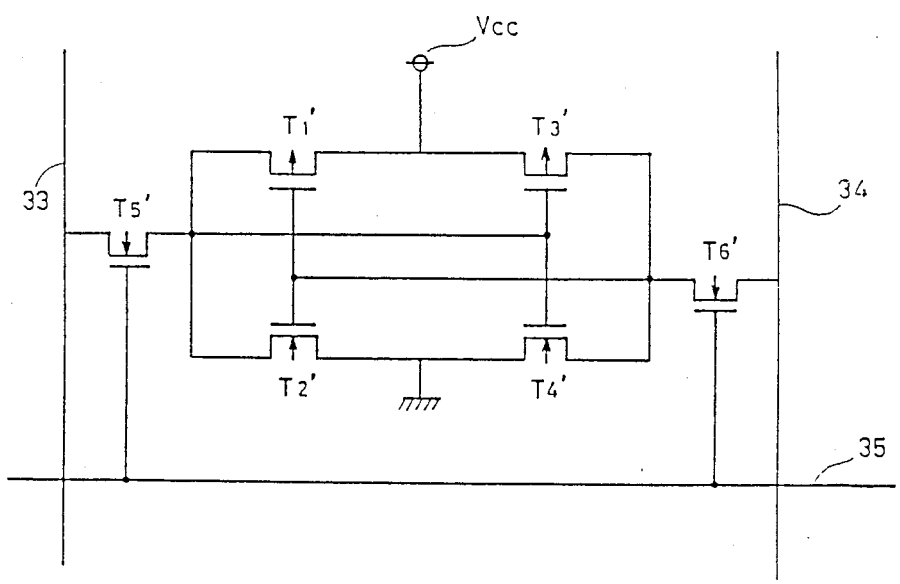
FIG. 8 is a circuit diagram showing an equivalent circuit of a SRAM to be made according to the method of this invention.

FIG. 8 shows an equivalent circuit of the circuit layout illustrated in FIG. 7B.

Figure 9A:
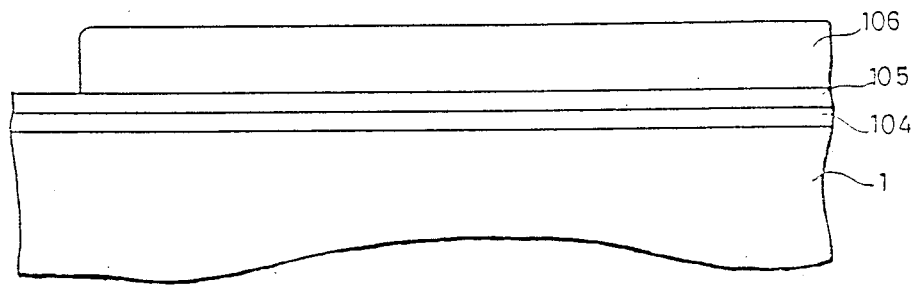
FIGS. 9A to 9P are cross-sectional views of a stacked CMOS semiconductor device showing successive steps of the manufacturing process according to this invention.
Figure 9B:
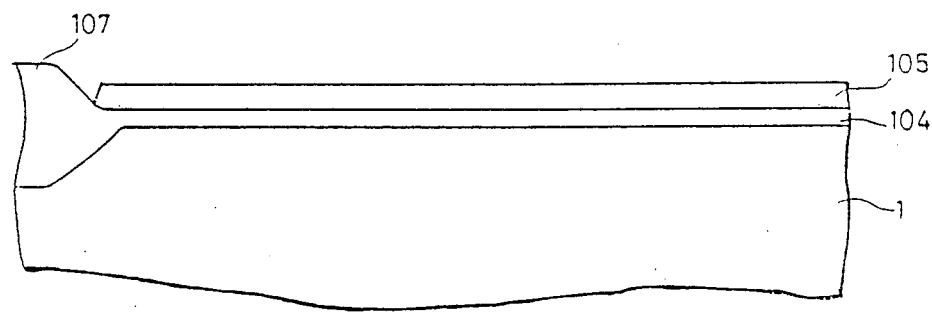
Figure 9C:
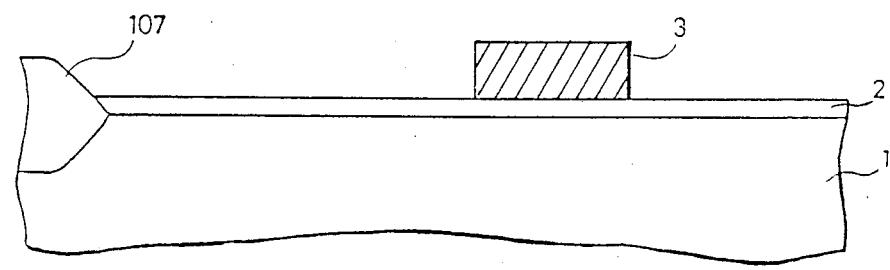
Figure 9D:
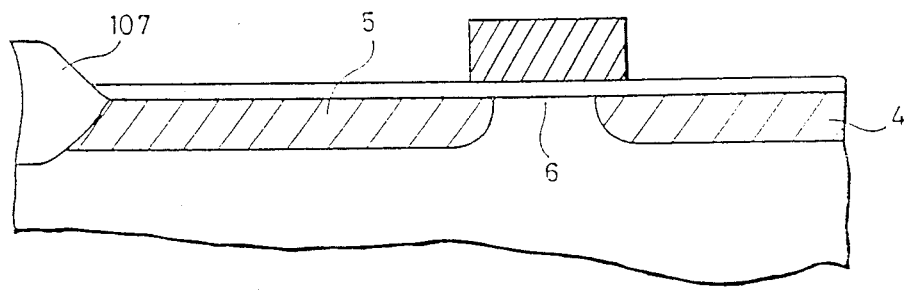
Figure 9E:
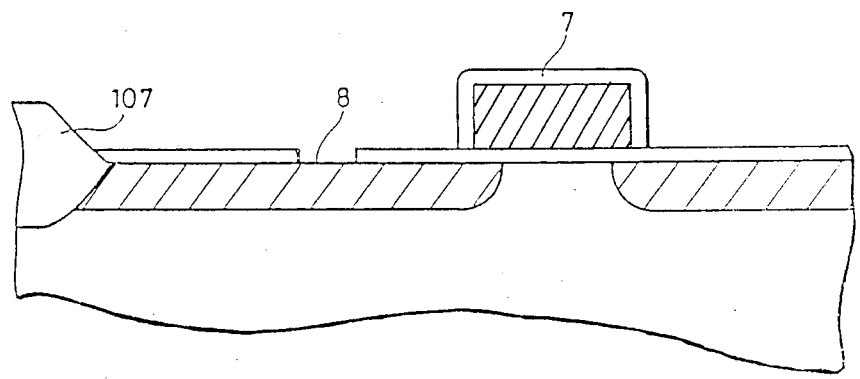
Figure 9F:
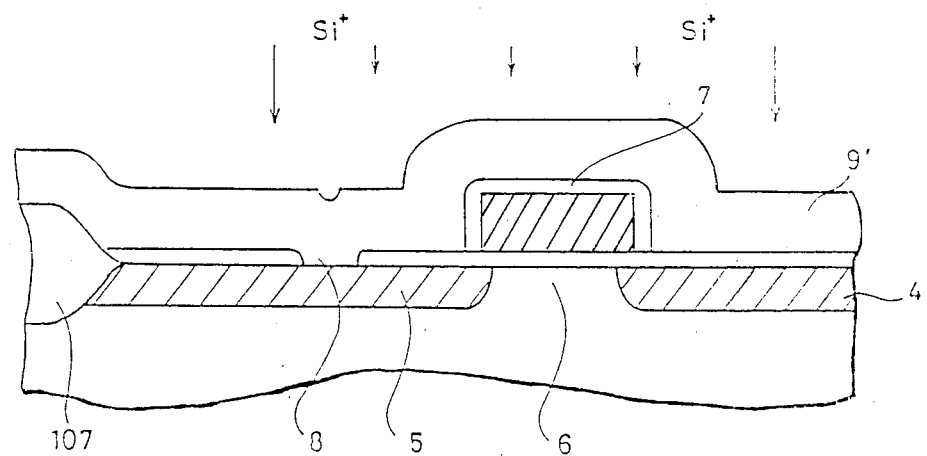
Figure 9G:
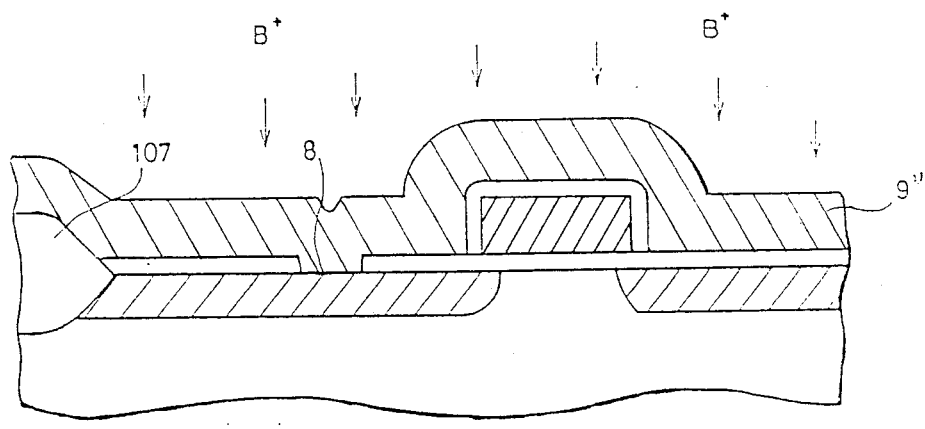
Figure 9H:
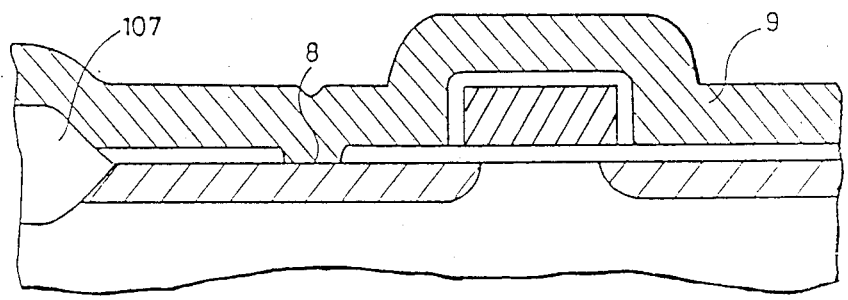
Figure 9I:
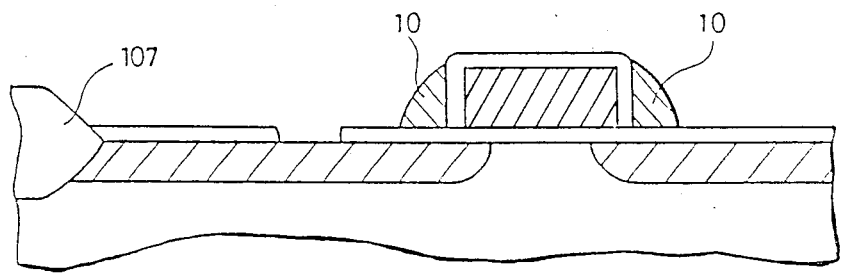
Figure 9J:
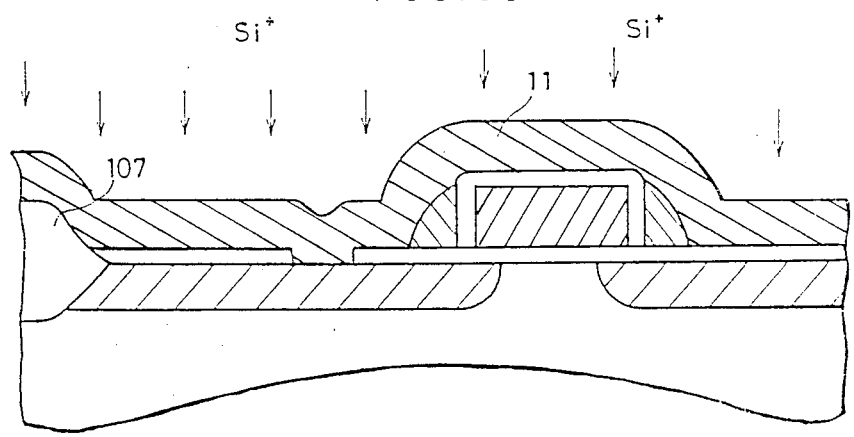
Figure 9K:
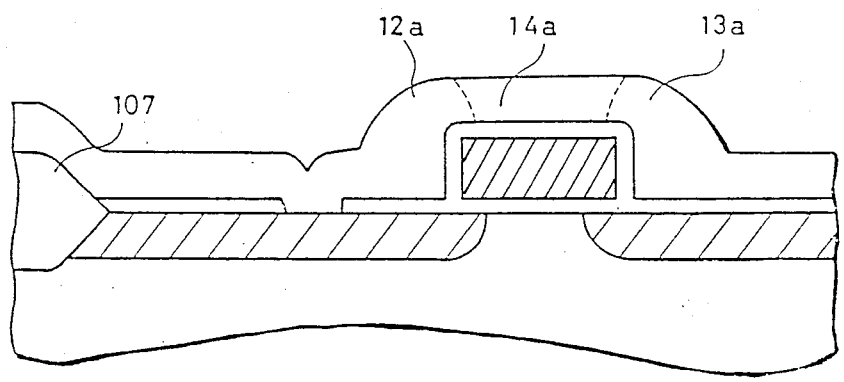

Now the method of manufacturing semiconductor memory devices having stacked structure according to this invention is described with reference to FIGS. 9A-9P which show a part of the device in cross section taken along line IX—IX of FIG. 7B. First, there is formed on a p-channel silicon substrate 1 a silicon oxide layer 104 by thermal oxidation. Then silicon nitride layer 105 and photoresist 106 are applied over the silicon oxide layer 104 (FIG. 9A). Using the photoresist 106 as a mask, the exposed portion of silicon nitride layer 105 are removed. Then utilizing the remaining silicon nitride layer 105 as a mask, a thick field oxide layer 107 is formed by means of a selective oxidation operation (FIG. 9B). After that, both silicon oxide layer 104 and silicon nitride layer 105 are also removed. On the substrate 1, another silicon oxide layer 2 is deposited as by thermal oxidation, and then a phosphorous doped polysilicon layer is applied over the silicon oxide layer 2, for example, by a low pressure CVD. When the selected portion of the the polysilicon layer is removed by a known photolithography and etching processes, a gate electrode 3 having at least two opposing sides and a top is formed as shown in FIG. 9C. Arsenic ions are injected in the substrate using the gate electrode 3 as a mask, and the resulting substrate undergoes a heat treatment during which arsenic diffusion regions 4, 5 are formed in a self-aligned manner. Thus, a n-channel MOS transistor is obtained comprised of the arsenic diffusion regions 4, 5 which serve as a source and drain, and a channel region 6 which is defined between the regions 4, 5 (FIG. 9D).

The next step covers the gate electrode 3 with silicon oxide layer 7 utilizing, for example, a thermal oxidation technique. Then there is provided an aperture or opening 8 in the silicon oxide layer 2 at a location above the drain regions 5 by means of the photolithography and etching (FIG. 9E). A chemical vapor deposition develops and applies a polysilicon layer 9' on the major surface of the substrate and the gate electrode 3, after which silicon ions are implanted into the silicon layer 9' (FIG. 9F). As a result of this silicon ion injection, the polysilicon layer 9' turns into an amorphous silicon layer 9''. Boron ions are then implanted into the layer (FIG. 9G), and the resulting silicon substrate 1 goes through a thermal anneal in a $N_2$ ambient at a temperature of 900°C. for ten hours. During the thermal anneal, a solid epitaxial growth is initiated at the surface region of silicon substrate exposed to the opening 8 and it proceeds to form a thin film or layer 9 of single-crystal silicon (FIG. 9H). The single-crystal silicon epitaxial layer 9 is then etched away by a reactive photo etching technique, leaving the sidewalls 10 of boron containing single-crystal silicon on the opposite sides of the gate electrode 3 with the silicon oxide layer 7 interposed between the sidewalls and the gate electrode 3 (FIG. 9I). A polysilicon layer is again disposed on the substrate and, as stated above, si ions are implanted into the polysilicon layer to turn it into an amorphous silicon layer. The resulting silicon substrate is then subject to a thermal anneal in an atmosphere of $N_2$ at an elevated temperature of 600°C. for ten hours, thereby causing solid epitaxial growth. The epitaxial growth is initiated on the single-crystal silicon sidewall 10 and proceeds to form a single-crystal silicon layer 11 (FIG. 9J). The silicon substrate 1 undergoes another heat treatment at an elevated temperature higher than that used in the preceding thermal anneal. As a result of this heat treatment, the boron ions within the boron doped single-crystal silicon sidewalls 10 diffuse into adjacent portions of the single-crystal silicon layer 11 and form p-channel diffusion regions 12a, 13a. The portion between the diffusion regions 12a, 13a defines a channel region 14a (FIG. 9K).

Figure 9L:
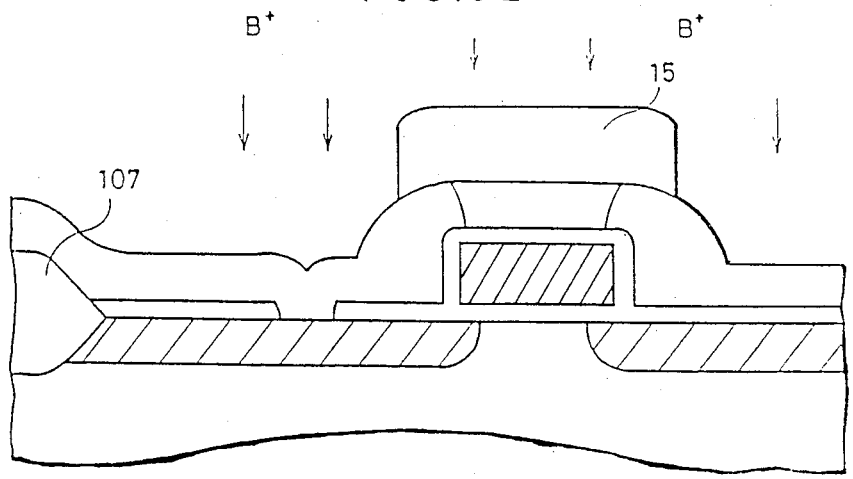

A photoresist 15 is then applied over a preselected portion of the silicon layer 11 by the photolithographic technique, and boron ions are implanted in the major portion of the silicon layer 11 (FIG. 9L).

Figure 9M:
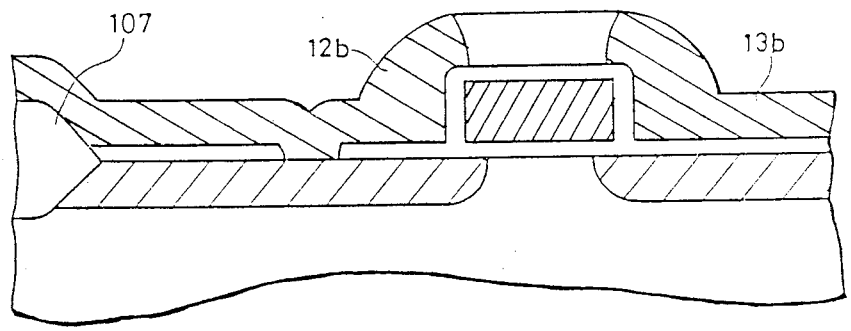
Figure 9N:
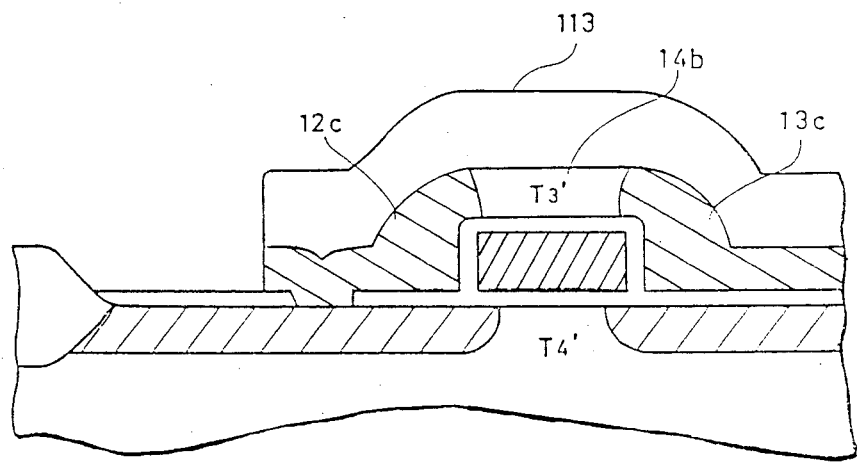
Figure 9O:
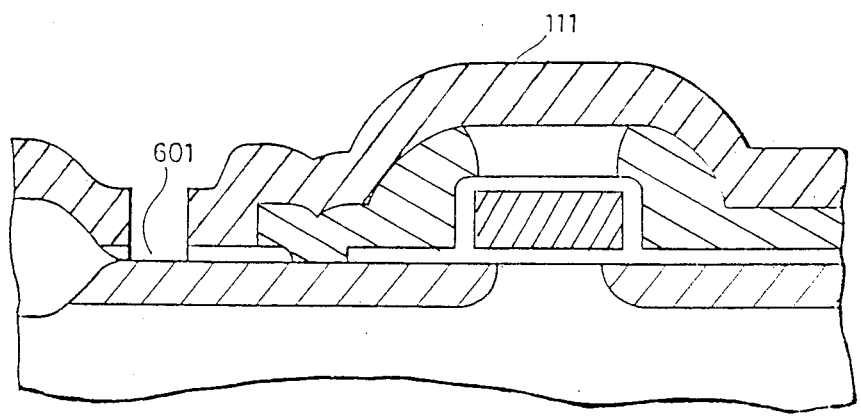
Figure 9P:
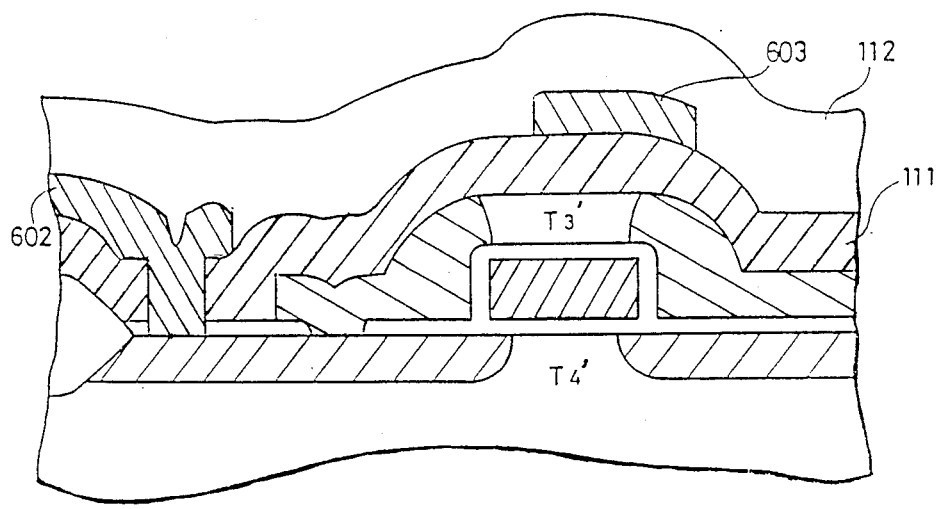

After removing the photoresist 15, the substrate is subject to another heat treatment and p-channel diffusion regions 12b, 13b are formed extending over the major portion of the silicon layer (FIG. 9M). Another photoresist 113 is applied to cover the desired portion of the silicon layer, and using this resist 113 as a mask, unmasked areas of the silicon layer 11 are etched away. As shown in FIG. 9N, this process produces a source region 12c, a drain region 13c and a channel region 14b of a p-channel MOS transistor with the source region 12c in contact with the drain 5 of the n-channel MOS transistor through the opening 8 (FIG. 9N). Upon removing the photoresist 113, a silicon oxide layer 111 is applied on the substrate to cover the substantial area thereof. A contact hole 601 at a predetermined location is made by using the photolithographic and etching treatments (FIG. 9O). As the last step, aluminum conductor layers 602, 603 and an aluminum layer 604 as shown in FIG. 7B are formed on the substrate in a desired circuit pattern, and a passivation layer 112 is finally applied to complete a SRAM having a stacked CMOS structure.

As explained in detail herein above, according to this invention, the source and drain regions of the upper transistor in the stacked semiconductor device are formed by the diffusion of the impurities from the sidewalls of the conductor layer, and, therefore, the channel region of the upper transistor is produced in a self-aligned manner. The self-aligned channel region, in turn, eliminates the need for a complicated mask alignment procedure. Thus, the manufacturing method of this invention assures the production of high density complementary semiconductor devices. Moreover, according to this invention, the sidewalls of the conductor layer are kept to form the source and drain regions of the upper transistor. This results favorably in the reduced electrical resistance in the source and drain regions, and makes it easier to lay out the aluminum conductor pattern on them.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing semiconductor devices, comprising the steps of:
   preparing a semiconductor composite structure comprising a semiconductor substrate having a major surface and containing a predetermined concentration of an impurity of a first conductivity type;
   forming in said semiconductor at said major surface first and second impurity regions of a second conductivity type spaced apart from each other, a portion of said substrate between said first and second impurity regions of the second conductivity type defining a first channel region;
   forming a first insulating layer on said major surface of said substrate;
   forming a first conductor layer on said first insulating layer at a location above said first channel region coextensively therewith, said first conductor layer having a top surface and two side surfaces, and covering the first conductor layer by a second insulating layer;
   forming sidewalls on said two opposing side surfaces of said first conductor layer by covering the side surface with a second conductor layer containing an impurity of the first conductivity type with said second insulating layer interposed between said side surfaces and said second conductor layer;
   forming a third conductor layer to cover said first and second insulating layer and said sidewalls; and
   diffusing said impurity of the first conductivity type from within said sidewalls into said third conductor layer to form a pair of spaced apart impurity regions within said third conductor layers, whereby the region between said pair of spaced apart impurity regions within said third conductor layer forming a second channel region,
   wherein said step of forming said sidewalls of the first conductivity type with said second conductor layer comprises a step of forming said sidewalls of the first conductivity type with a first single-crystal conductor layer,
   wherein said first single-crystal conductor layer comprises a first single-crystal silicon layer, and
   wherein said step of forming said sidewall structures of the first conductivity type with said first single-crystal silicon layer comprises the steps of
      forming a second insulating layer on said top surface and said two side surfaces of said first conductor layer;
      forming a first polysilicon layer on said first and second insulating layers;
      converting said first polysilicon layer into a first single-crystal silicon layer of the first conductivity type; and
      etching away said first single-crystal silicon layer leaving said sidewalls as they are.

2. A method for manufacturing semiconductor devices according to claim 1, wherein;
   said step of converting said first polysilicon layer into said first single-crystal silicon layer of the first conductivity type comprises the steps of
      exposing at least a portion of said major surface of said semiconductor substrate by removing a portion of said first insulating layer at a location selected to be over either of said first and second impurity regions;
      converting said first polysilicon layer into an amorphous silicon layer;
      doping ions of the second conductivity type into said amorphous silicon layer; and
      growing a solid epitaxial layer, initiating the epitaxial layer from said exposed portion of said major surface of said semiconductor substrate.

3. A method for manufacturing semiconductor devices according to claim 2, wherein:
   said step of converting said first polysilicon layer into said amorphous silicon layer comprises a step of doping silicon ions into said first polysilicon layer.

4. A method for manufacturing semiconductor devices according to claim 1, wherein:
   said step of forming said third conductor layer comprises a step of forming a second single-crystal silicon layer.

5. A method for manufacturing semiconductor devices according to claim 4, wherein:
   said step of forming said second single-crystal silicon layer comprises a step of growing a solid epitaxial layer, initiating the epitaxial layer from said first single-crystal silicon layer.

6. A method for manufacturing semiconductor devices according to claim 5, wherein:
   said step of growing a solid epitaxial layer comprises the step of forming a second polysilicon layer over said first and second insulating layers on said substrate; and converting said second polysilicon layer into an amorphous layer by doping silicon ions into said second polysilicon layer; and subjecting said amorphous silicon layer to a heat treatment under predetermined conditions.

7. A method for manufacturing semiconductor devices according to claim 6, comprising the further step of:

forming a resist over said second channel region and doping said impurity of said first conductivity type into said semiconductor substrate from above.

8. A method for manufacturing semiconductor devices according to claim 7, wherein:

said composite semiconductor structure comprises a field effect transistor of the second conductivity type, said first conductor layer forming a gate electrode and said first and second impurity regions of the second conductivity type forming source and drain regions, respectively.

9. A method for manufacturing semiconductor devices according to claim 8, wherein:

said pair of impurity regions of the first conductivity type within said third conductor layer form a source region and a drain region, respectively, and said first conductor layer forms a gate electrode whereby said pair of impurity regions of the first conductivity type within said third conductor layer and said first conductor layer comprises a field effect transistor of the first conductivity type.

10. A method for manufacturing semiconductor devices according to claim 9, wherein:

said field effect transistor of the first conductivity type and said field effect transistor of the second conductivity type comprise a CMOS transistor.

11. A method for manufacturing semiconductor devices according to claim 10 wherein:

said semiconductor composite structure includes a SRAM.

12. A method for manufacturing semiconductor devices according to claim 1, comprising the further step of:

forming a resist over said second channel region and doping said impurity of said first conductivity type into said semiconductor substrate from above.

13. A method for manufacturing semiconductor devices according to claim 12, wherein:

said composite semiconductor structure comprises a field effect transistor of the second conductivity type, said first conductor layer forming a gate electrode and said first and second impurity regions of the second conductivity type forming source and drain regions, respectively.

14. A method for manufacturing semiconductor devices according to claim 13, wherein:

said pair of impurity regions of the first conductivity type within said third conductor layer form a source region and a drain region, respectively, and said first conductor layer forms a gate electrode whereby said pair of impurity regions of the first conductivity type within said third conductor layer and said first conductor layer comprise a field effect transistor of the first conductivity type.

15. A method for manufacturing semiconductor devices according to claim 14, wherein:

said field effect transistor of the first conductivity type and said field effect transistor of the second conductivity type comprise a CMOS transistor.

16. A method for manufacturing semiconductor devices according to claim 15, wherein:

said semiconductor composite structure includes a SRAM.

* * * * *